United States Patent
Valtolina et al.

(10) Patent No.: US 7,443,929 B2
(45) Date of Patent: Oct. 28, 2008

(54) METHOD AND CIRCUIT FOR ADAPTIVE CONTROL OF THE BANDWIDTH OF A CARRIER RECOVERY LOOP IN RADIO TRANSMISSION SYSTEMS

(75) Inventors: Roberto Valtolina, Trezzo sull'Adda (IT); Massimo Brioschi, Monza (IT)

(73) Assignee: ALCATEL, Paris (FR)

( * ) Notice: Subject to any disclaimer, the term of this patent is extended or adjusted under 35 U.S.C. 154(b) by 452 days.

(21) Appl. No.: 11/043,205

(22) Filed: Jan. 27, 2005

(65) Prior Publication Data

US 2005/0169418 A1 Aug. 4, 2005

(30) Foreign Application Priority Data

Jan. 28, 2004 (EP) .................................. 04290224

(51) Int. Cl.
*H04L 27/00* (2006.01)
*H03D 3/18* (2006.01)
*H03D 3/24* (2006.01)

(52) U.S. Cl. .......................... 375/326; 375/327; 375/376

(58) Field of Classification Search ......... 375/371–375, 375/376, 326, 325, 316, 327; 329/204–308; 327/141, 147, 156

See application file for complete search history.

(56) References Cited

U.S. PATENT DOCUMENTS 3,876,939 A * 4/1975 Lerner .......................... 455/43
2005/0129142 A1* 6/2005 Yellin et al. .................. 375/302

FOREIGN PATENT DOCUMENTS

EP 1 115 237 A1 7/2001
WO WO 01/80511 A1 10/2001

OTHER PUBLICATIONS

T. Oellermann et al, "Performance evaluation of a coded CDMA optical system", Military Communications Conference, 1996, Milcom '96, Conference Proceedings, IEEE, Mclean VA, Oct. 21-24, 1996, NY—IEEE—Oct. 21, 1996, pp. 0-8-912, XP010204032.

* cited by examiner

*Primary Examiner*—Tesfaldet Bocure
(74) *Attorney, Agent, or Firm*—Sughrue Mion, PLLC

(57) ABSTRACT

A method for adaptively controlling bandwidth of a carrier recovery loop in radio transmission systems, wherein the phase error in a PLL is adjusted to a minimum level by means of a loop filter incorporated in said PLL. The phase noise value in the local oscillator is determined and the value of the additive white gaussian noise in the PLL is estimated. Next these values are applied in a predetermined mathematical relationship indicative of the phase error in said PLL in such a manner that the desired wavelength of the PLL can be determined by corresponding to a minimum value of the phase error.

4 Claims, 1 Drawing Sheet

METHOD AND CIRCUIT FOR ADAPTIVE CONTROL OF THE BANDWIDTH OF A CARRIER RECOVERY LOOP IN RADIO TRANSMISSION SYSTEMS

FIELD OF THE INVENTION

The present invention relates to a radio transmission system. More particularly the invention relates to a circuit and a method for the control of the bandwidth of a carrier recovery loop in such radio transmission systems.

BACKGROUND OF THE INVENTION

In order to make efficient use of the microwave radio spectrum, state-of-art digital point-to-point radio systems employ highly bandwidth-efficient modulation techniques. At present, certain known commercial systems employ 128 QAM signal constellation, nevertheless some 512 QAM prototypes are currently being field-tested. For the sake of clarity it is to be noted that "QAM" stands for Quadrature Amplitude Modulation which is a well known amplitude modulation scheme in which amplitude modulation is performed by two separate signals of two sinusoidal carriers having the same amplitude and frequency but being in phase quadrature, the modulated signals are then added for transmission on a single channel.

As the number of the points of the signal constellation grows, the system becomes more sensitive to all types of linear and nonlinear signal distortion. A particularly critical issue in bandwidth-efficient QAM systems is the phase noise (PN) of the local oscillators (LO) which are used to convert the modulated signal from IF to RF and vice versa. Together with other noise-like degrading effects, LO—phase noise (LOPN) gives rise to a constant irreducible bit error rate (BER) independently from the power of the received signal.

There are two ways known in the related art to face the problem of LOPN. The first known method is to achieve low noise local oscillators. However, the higher the radio frequency is, the more difficult it is to design and to produce a local oscillator with low phase noise. The second known solution is to choose a demodulation process which is somehow non sensitive towards PN.

Consequently the first solution may become considerably expensive, taking into account in particular the fact that at present the radio frequencies that are being used are growing higher and higher in value (e.g. up to 90 GHz). Nevertheless, the second solution can be implemented with phase locked loop (PLL). In fact the PLL principle has been successfully used for decades for tracking the carrier phase. There is plenty of literature available to the public on PLL design and techniques. As a non limiting example reference is made to Floyd M. Gardner, "Phaselock Techniques", Second Edition, John Wiley & Sons.

In the context of the above problem, the bandwidth of the PLL is the main parameter to take under consideration. The wider the bandwidth is, the better the demodulator ability becomes in order to track LOPN.

However, there are two particular limits in achieving wide bandwidth for the PLL. One such limitation is the introduction of an additional source of phase noise which is due to the phase estimator error introduced by the modulated signal itself; this additional phase noise—that depends also from the quality of the received signal level and from the amount of the additive white gaussian noise (AWGN)—must, as much as possible, remain much lower than the original one. The second limit is the loop electrical delay. It turns out that a long loop electrical delay makes it impossible to go beyond a certain bandwidth, because the phase transfer function of the PLL approaches levels close to instability.

From the above discussion it is clear that in order to reach an optimum design of the PLL, its bandwidth and its transfer function depend on the amount of LOPN as well as on the amount of the AWGN.

The "standard" solution for achieving the above objectives would be to design a PLL with a fixed bandwidth as wide as possible. However, taking into account that the optimum bandwidth of the PLL depends on the signal to noise ratio of the received signal, then the choice of a fixed bandwidth cannot be considered an "optimum" solution because the signal to noise ratio can change depending on the circumstances.

SUMMARY OF THE INVENTION

It is therefore an object of the present invention to overcome the above mentioned prior art drawbacks. This objective is achieved by the solution proposed by the present invention according to which by means of adaptively changing the transfer function of the PLL according to the signal to noise ratio (SNR) of the received signal, the BER of the system is improved. In fact, based on knowing the LOPN and estimating the amount of AWGN, it becomes possible to adaptively find the best bandwidth of the PLL, leading eventually to a substantial improvement in BER values.

Accordingly it is an object of the present invention to provide a method for adaptive control of bandwidth of a carrier recovery loop in radio transmission systems, said system comprising a local oscillator and a phase locked loop—PLL—for tracking a carrier phase, the PLL having a transfer function, characterized in that a phase error in the PLL is adjusted to an optimum level by means of a loop filter incorporated in said PLL, said optimization of the phase error in the PLL comprising the steps of:
 a-determining a first value relative to phase noise in the local oscillator;
 b-estimating a second value relative to additive white gaussian noise in the PLL;
 c-applying the said first and second values in a predetermined mathematical relationship representing the phase error value as a function of a transfer function value in said PLL; and
 d-selecting a value of the PLL transfer function corresponding to an optimum phase error value according to said predetermined mathematical relationship.

According to an aspect of the present invention, said optimum phase error value is a minimum value.

Another object of the present invention is that of providing a system for performing adaptive control of bandwidth of a carrier recovery loop in radio transmission systems, comprising a local oscillator and a phase locked loop—PLL—for tracking a carrier phase, characterized in that the PLL comprises a loop filter incorporated therein for adjusting a phase error in the PLL according to the steps of the method above.

These and further features and advantages of the invention are explained in more detail in the following description as well as in the claims with the aid of the accompanying drawing.

DESCRIPTION OF A PREFERRED EMBODIMENT

Figure 1:
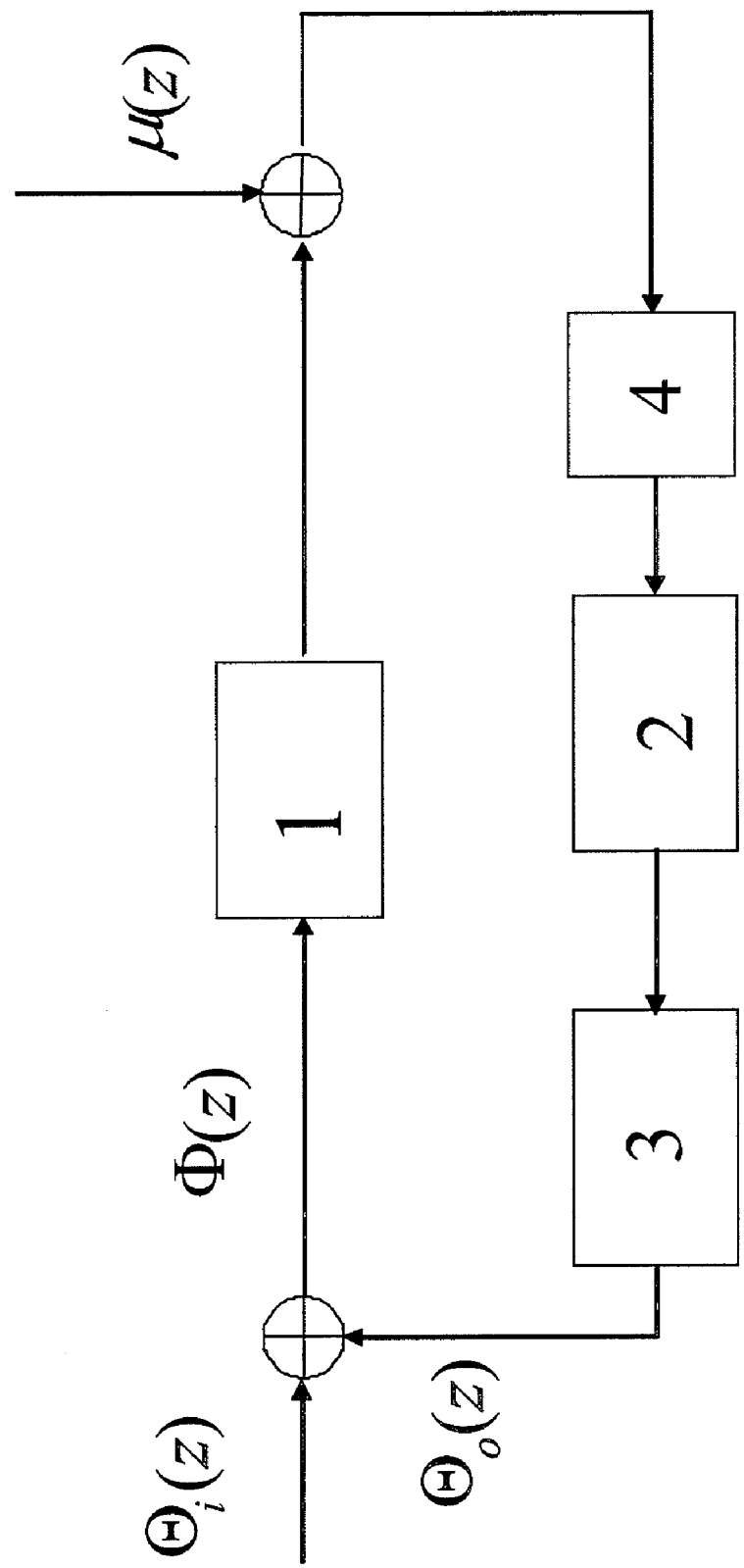
FIG. 1 is a block diagram showing a basic scheme of a PLL for use in the solution of the present invention.

There are various known arrangements for PLLs, however, without loss of generality, it can be considered that the basic structure of a PLL can be represented in the block diagram of FIG. 1 wherein the PLL circuit comprises a phase detector 1, a loop filter 2, a voltage controlled oscillator 3 and an optional pure delay 4, the latter representing the undesired effect of a delay present in the loop, for example, due to a decision delay in a decision feedback loop.

Furthermore the additional source of phase noise is modeled by $\mu(k)$ which, as mentioned further above, is due to the phase estimator error introduced by the modulated signal itself, depending also from the amount of AWGN.

The input $\Phi(z)$ to the phase detector 1 is the difference between two signals, namely an input signal having a phase $\Theta_i(z)$ and an output signal fed-back to the input of the phase detector 1 having a phase $\Theta_o(z)$.

In the following, for the sake of simplicity, it is assumed that the system is already equalized and frequency-synchronized, and that both timing recovery and relative gain control have been established. Under the above assumptions, the baud-rate samples $r_k$ of the received signal, as it is know in the related art can be expressed as:

$$r_k = a_k \cdot e^{+j\Phi_i(k)} + n_k \quad (1)$$

where $a_k$ is a complex number representing the QAM symbol transmitted at time kT, wherein T is represents time in the expression 1/T which is the signaling rate and k is an integer corresponding to the "k"$_{th}$ symbol; $\Phi_i$ denotes the unknown phase and $n_k$ are the noise samples of AWGN.

Reference to the relationship (1) above, can be found among other available literature, in H. Meyr, M. Moeneclaey, S. A. Fetchel, "Digital Communication Receivers", John Wiley & Sons, 1998, page 341.

An appropriate approach to the analysis of the PLL is the small signal analysis in which it is assumed that the phase error $\Phi = \Phi_i - \Phi_0$ is small enough so that the non linear characteristics of the phase detector can be linearized; this standard technique permits to carry out the PLL analysis in terms of z-transform or s-transform (that can be used only with linear systems).

The phase detector characteristic, generally referred to as S-curve in the related literature, is defined as the average of the phase error detector output: $g(\Phi) = E[x]$, where E is the symbol of expectation and x is the output of the phase detector 1.

The PLL open loop z-transform transfer function is shown below (equation 2). This is also a known and conventional formula in the techniques related to PLLs: in a simplified interpretation it may be said that this formula is the multiplication of the transfer function of each of the blocks shown in FIG. 1:

$$L(z) = \frac{K \cdot F(z) \cdot z^{-N}}{1 - z^{-1}} \quad (2)$$

In the above, L(z) represents the PLL open loop transfer function, K is the phase detector gain, i.e. the slope of the S-curve of the phase detector in the origin (i.e. $K = \dot{g}(0)$), F(z) is the transfer function of the loop filter and N represents the number of symbols in time delay. It is further to be noted that the open loop delay is expressed as NT, shown in FIG. 1 by reference numeral 4, wherein T represents symbol time.

Reference to the above relationship (2) may be found in H. Meyr, M. Moeneclaey, S. A. Fetchel, "Digital Communication Receivers", John Wiley & Sons, 1998, pages 342-343 and 97-117.

The solution according to the invention is based on designing a loop filter 2, which is capable of minimizing the phase error variance $\sigma_e^2$, subject to the following data and constrains:

The power of the AWGN samples $n_k$ is represented by $\sigma_n^2$; the power spectral density of the phase noise $\Phi_i(k)$ is represented by $S_\Phi(f)$; where (f) is frequency. It is assumed that $n_k$ and $\Phi_i(k)$ are uncorrelated.

K is the phase detector gain which is a fixed value but only known to belong to an interval $K \in [K_1, K_2]$, this parameter reflects the sensitivity of the S-curve of the phase detector to signal to noise ratio; The phase error variance is thus expressed as follows:

$$\sigma_e^2 = \frac{\sigma_n^2}{K^2} \int_{\frac{-1}{2T}}^{\frac{1}{2T}} \left|\frac{L(f)}{1+L(f)}\right|^2 df + \int_{\frac{-1}{2T}}^{\frac{1}{2T}} S_\varphi(f) \cdot \left|\frac{1}{1+L(f)}\right|^2 df \quad (3)$$

Here again, reference to the above relationship (3) may be found in H. Meyr, M. Moeneclaey, S. A. Fetchel, "Digital Communication Receivers", John Wiley & Sons, 1998, pages 342-343 and 97-117.

As can be noted from (3), increasing the loop bandwidth, the first term increases, related to AWGN contribution represented by $\sigma_n^2$ while the second term decreases, related to phase noise contribution as represented by $S_\Phi(f)$. This equation shows clearly the fact that the phase error, and consequently the optimum bandwidth are a function of phase noise and additive white gaussian noise.

Therefore, knowing the phase noise of the local oscillator (LOPN) and estimating the amount of additive white gaussian noise, it is possible to adaptively find the best bandwidth that results in the minimization of equation (3), leading eventually to a great improvement in BER curves. This is done by obtaining the value of the transfer function of the PLL corresponding to the minimum value obtained for the phase error.

It is to be noted that the mathematical relationship shown in equation (3) above is only an example provided in this description for a clear understanding of the solution provided by the invention. The scope of the invention is not to be construed as to be limited only to the above mathematical relationship. Those skilled in the related art would realize that other mathematical expressions can also be used in order to obtain the desired values of the PLL bandwidth according to the invention.

The main advantage of the new solution is that, at every symbol time, the "optimum" PLL transfer function can be found and used, thus obtaining in this manner an improvement in BER.

In order to estimate the power of the additive white gaussian noise $\Phi_n^2$ various strategies exist from which, without loss of generality, we can mention the estimation of the Mean Square Error (MSE), that is a direct measurement of the amount of additive white gaussian noise.

At this point the minimization of equation (3) can be done in different ways: in a preferred but not limiting embodiment, the optimum value for L(z) and, as a consequence, the optimum value for F(z), can be found by direct calculation or it can be found by making use of pre-calculated lookup tables. The cost function to be minimized can be depicted by means of other known expressions as a results of applying different models or different simplifications, within the scope of the solution proposed by the present invention, which is based on providing a radio transmission system with an adaptive bandwidth of the carrier recovery loop.

The invention claimed is:

1. A method for adaptive control of bandwidth of a carrier recovery loop in a radio transmission system, said system comprising a local oscillator and a phase locked loop (PLL) for tracking a carrier phase, the PLL having a transfer function, characterized in that a phase error in the PLL is adjusted to an optimum level by means of a loop filter incorporated in said PLL, said optimization of the phase error in the PLL comprising, at every symbol time, the steps of:

determining a first value relative to phase noise in the local oscillator;

estimating a second value relative to additive white Gaussian noise in the PLL;

applying the said first and second values in a predetermined mathematical relationship representing the phase error variance $\sigma_e^2$ as a function of a transfer function $L(f)$ of said PLL, and as a function of said phase noise and of said additive Gaussian noise; and calculating a value of said PLL transfer function $L(f)$ corresponding to an optimum phase error variance $\sigma_e^2$ according to said predetermined mathematical relationship.

2. The method of claim 1 wherein said optimum phase error value is a minimum value.

3. The method of claim 1 wherein the predetermined mathematical relationship representing the phase error value as a function of a transfer function value in said PLL is expressed as follows:

$$\sigma_e^2 = \frac{\sigma_n^2}{K^2} \int_{-\frac{1}{2T}}^{\frac{1}{2T}} \left| \frac{L(f)}{1+L(f)} \right|^2 df + \int_{-\frac{1}{2T}}^{\frac{1}{2T}} S_\varphi(f) \cdot \left| \frac{1}{1+L(f)} \right|^2 df$$

wherein:

$\sigma_e^2$ represents phase error variance;

$\sigma_n^2$ represents power value of additive white gaussian noise samples;

$S_\Phi(f)$ represents power spectral density of the phase noise, where (f) is frequency;

T represents symbol time;

K represents linearized phase detector gain; and

L(f) represents the transfer function of the PLL at frequency f.

4. A system for performing adaptive control of bandwidth of a carrier recovery loop in radio transmission systems, comprising a local oscillator and a phase locked loop—PLL—for tracking a carrier phase, characterized in that the PLL comprises a loop filter incorporated therein for adjusting a phase error value in the PLL according to the steps of the method of claim 1.

* * * * *